United States Patent
Hsiung et al.

(10) Patent No.: US 7,706,115 B2
(45) Date of Patent: Apr. 27, 2010

(54) OVER-VOLTAGE INDICATOR AND RELATED CIRCUIT AND METHOD

(75) Inventors: Wen-Ching Hsiung, Hsinchu (TW);
Jeng-Dau Chang, Tainan (TW);
Chia-Liang Lai, Changhua (TW);
Kuan-Yu Chen, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 389 days.

(21) Appl. No.: 11/934,767

(22) Filed: Nov. 3, 2007

(65) Prior Publication Data

US 2008/0285196 A1    Nov. 20, 2008

(30) Foreign Application Priority Data

May 16, 2007  (TW) ............................... 96117443 A

(51) Int. Cl.
*H02H 3/027* (2006.01)
(52) U.S. Cl. ..................... 361/91.3; 361/91.1; 361/91.7
(58) Field of Classification Search ................ 361/91.1, 361/91.3, 91.7
See application file for complete search history.

(56) References Cited

U.S. PATENT DOCUMENTS

| | | | | |
|---|---|---|---|---|
| 5,513,060 | A | * 4/1996 | Bremond | ....................... 361/58 |
| 6,359,391 | B1 | * 3/2002 | Li | ............................... 315/291 |
| 6,927,602 | B2 | 8/2005 | Ker et al. | |
| 2007/0097043 | A1 | * 5/2007 | Yang | ............................ 345/82 |

* cited by examiner

*Primary Examiner*—Stephen W Jackson
*Assistant Examiner*—Tien Mai
(74) *Attorney, Agent, or Firm*—Winston Hsu

(57) ABSTRACT

Over-voltage indicator and related circuit and method. The over-voltage indicator can work with an I/O circuit of a chip for detecting over-voltage in an I/O pad and providing an indication signal accordingly. When over-voltage does not happen, the over-voltage indicator continues to detect a signal level of the I/O pad and keeps the indication signal low. Once over-voltage is detected, the over-voltage indicator pauses detecting, asserts a high level in the indication signal, and periodically resumes detecting until end of over-voltage is detected. With informing provided by the indication signal, a core cell of the chip can perform proper operation to reduce potential damage caused by over-voltage.

6 Claims, 5 Drawing Sheets

OVER-VOLTAGE INDICATOR AND RELATED CIRCUIT AND METHOD

FIELD OF THE INVENTION

An over-voltage indicator and related circuits and methods are provided, more specifically, an over voltage indicator, related circuits and methods where periodic detecting and pausing detecting are alternatively switched during over-voltage and a logical indication signal can be provide to activate proper protection procedure are provided.

BACKGROUND OF THE INVENTION

System circuits like chips, integrated circuits (ICs) and system-on-chip (SOC) have become the key hardware components in modern information society. Generally speaking, a chip has a core circuit and an I/O circuit. The core circuit implements main functions of the chip, e.g., logic operations, signal processing/conversion, coding/decoding and data management. The I/O circuit handles input/output signal exchange with external circuits through pins and pads of the chip, such that the core circuit can communicate with external circuits. Because the I/O circuit directly interfaces external environment (external circuits), the I/O circuit must has a certain level of tolerance for variety of external environments.

Please refer to FIG. 1. FIG. 1 illustrates a prior art I/O circuit 10 in a system circuit S0. The system circuit S0 can be a chip, and an internal circuit 12 can be a core circuit of the chip or a pre-driver for signal outputting. The I/O circuit 10 includes a buffer 18 for driving output signal. The buffer 18 is set between the internal circuit 12 and an I/O port (labeled as I/O in FIG. 1), where the I/O port is a pad (pin) of the chip. The information outputted by the internal circuit 12 can be transmitted to the I/O circuit 10 in the form of the input signals IP and IN (which are usually a pair of differential signals), then the buffer 18 can drive an output signal DP at the I/O port according to the input signals IP, IN; and thus information of the internal circuit 12 can be outputted.

Since the I/O port directly interfaces external environment (e.g., a printed circuit board or another chip), signal level at the I/O port is easily affected by external environment. For example, over-voltage may happen at the I/O port. That is, because of unexpected short-circuit or other reasons, voltage level at the I/O port may rise abnormally, even rise above the operation bias voltage of the I/O circuit 12. To reduce affection of over-voltage, the buffer 18 has an additional stacked transistor Mc, and the I/O circuit 10 also includes an n-well pull-up circuit 16 and a gate tracking circuit 14 for over-voltage protection. The n-well pull-up circuit 16 connects to the I/O port for responding over-voltage by providing a signal VNW and a gate signal GT according to voltage at the I/O port. The gate tracking circuit 14 connects between the internal circuit 12 and the buffer 18 for controlling electrical connection between the internal circuit 12 and the buffer 18.

As shown in FIG. 1, the buffer 18, the gate tracking circuit 14 and the n-well pull-up circuit 16 of the I/O circuit 10 are biased between operation bias voltages VCCA (a positive voltage) and GNDA (ground). The buffer 18 has two transistors Md1, Md2 and the stacked transistor Mc. The transistors Md1, Md2 drive the output signal DP at the I/O port, and the stacked transistor Mc locates between the transistors Md1, Md2. Note that the bulk of the transistor Md1 is biased by the signal VNW. The n-well pull-up circuit 16 includes transistors Ma1-Ma3; the gate tracking circuit 14 has transistors Mb1, Mb2 forming a transmission gate and another transistor Mb3. The bulk of the transistor Mb2 and the source of the transistor Mb3 are also biased by the signal VNW. That is, the three p-channel transistors Md1, Mb2 and Mb3 have their n-well bulks biased by the signal VNW.

Normal operation (when over-voltage does not happen) of the internal circuit 12 and the I/O circuit 10 can be described as follows. In normal operation, signal level at the I/O port should be alternating between the operation bias voltages VCCA and GNDA. Then, in the n-well pull-up circuit 16, the transistors Ma2, Ma3 are off (with their gates biased at voltage VCCA), the gate signal GT remains a low level (close to voltage GNDA), and the transistor Ma1 is on to keep the signal VNW high (close to voltage VCCA). In the gate tracking circuit 14, voltage at the node Np1 should also alternate between the operation bias voltages VCCA and GNDA, so the transistor Mb3 is off (with it gate biased at voltage VCCA), the transistor Mb1 is on and the transistor Mb2 is also on (with its gate biased by the low gate signal GT), so the node Np2 can be conducted to the node Np1 allowing the signal IP (from the internal circuit 12) to be transmitted to the buffer 18 for normal signal outputting.

On the other hand, when over-voltage occurs at the I/O port, the voltage level at the I/O port rise above the operation bias voltage VCCA; for example, the operation bias voltage VCCA is 3.3V, and voltage level at the I/O port may rise to 5V because of unexpected external environment change (like short-circuit). Under over-voltage circumstance, because the voltage level at the I/O port (i.e., level of the signal DP) rises above the voltage VCCA, the transistors Ma2, Ma3 in the n-well pull-up circuit 16 start to turn on. The turned-on transistor Ma3 makes the signal GT rise close to the over-voltage level of the signal DP, and also turns off the transistor Ma1. Similarly, the turned-on transistor Ma2 pulls the signal VNW close to the over-voltage level of the signal DP.

In the buffer 18, the voltage levels at the node Np3 and the bulk of the transistor Md1 both rise close to the over-voltage signal DP, so the transistor Md1 is off. The transistor Mc is on such that the node Np4 has a level close to a voltage (VCCA−Vth_Mc), where Vth_Mc is threshold voltage of the transistor Mc. In this way, over-voltage at the node Np3 will not directed feed into the node Np4, and then the transistor Md2 is protected.

In the gate tracking circuit 14, the transistor Mb3 turns on with its source signal VNW rising above the operation bias voltage VCCA due to over-voltage and the voltage level at the node Np1 is pulled close to the over-voltage level of the signal DP. For the transistor Mb2, over-voltage levels at its gate (biased by the signal GT), its bulk (biased by the signal VNW) and the node Np1 make the transistor Mb2 off. In this way, over-voltage will not damage the internal circuit 12 through the node Np2.

However, the prior art I/O circuit 10 in FIG. 1 has some disadvantages while performing over-voltage protection. For example, when over-voltage happens, reliability of the transistor Mb2 can be damaged. As described above, during over-voltage event, the transistor Mb2 has over-voltage at its gate (biased by the gate signal GT), its bulk (biased by the signal VNW) and the node Np1. At this time, if the internal circuit 12 happens to send a low IP signal to the node Np2, gate oxide of the transistor Mb2 will suffer a great voltage difference across the node Np2 (with a low level voltage) and the gate (with an over-voltage signal GT). This over-voltage voltage difference usually can reach a level close to breakdown voltage of the gate oxide of the transistor Mb2, and thus make the transistor Mb2 vulnerable. The aforementioned reliability concern also addresses anther disadvantage of the prior art: the prior art over-voltage protection technique can not inform the internal circuit 12 of incoming over-voltage, leaving no room for the internal circuit 12 to properly response the over-voltage events.

SUMMARY OF THE INVENTION

An objective of the invention is providing an over-voltage indicator, related circuit/system and method. According to the disclosure of the invention, an over-voltage indicator is set in an I/O circuit of a system circuit (e.g., a chip or an IC) for providing an indication signal (which can be a logic signal) according to occurrence of over-voltage. The indication signal is fed-back to an internal circuit (a pre-driver or a core circuit) of the system circuit, such that the internal circuit can perform a protection procedure in response of over-voltage. For example, signal level outputted to the I/O circuit can be kept in a safe level, so as to avoid over-voltage damage in a transmission gate of a gate tracking circuit in the I/O circuit.

More specifically, one objective of the invention is providing an over-voltage indicator for providing an indication signal to reflect occurrence of over-voltage at an I/O port. The over-voltage indicator includes a comparator, a switch, a timer, a detector, a control circuit, a latch, a trigger circuit and a load. The comparator connected between the I/O port and a sample end is capable of comparing whether a signal level at the I/O port is higher than a predetermined conduction level; if so, the comparator conducts the I/O port to the sample end; if not, the comparator stops conducting the I/O port to the sample end. The switch is connected between the sample end and a detection end; when the switch is turned on, the switch conducts the sample end to the detection end; when the switch is turned off, the switch stops conducting between the sample end and the detection end. The timer is capable of providing a timing signal; when the timer is triggered, the timer starts timing for a predetermined interval, and the timer can reflects completion of timing using the timing signal. The detector is connected to the detection end and is capable of comparing whether a signal level at the detection end is higher than a predetermined standard; if so, the detector triggers the timer to start timing. Also the load is connected to the detection end; when the switch is turned on and the comparator stops conducting, the load is capable of keeping the signal level at the detection end lower than the predetermined standard. The control circuit is connected between the timer, the detector and the switch; when the detector detects that the signal level at the detection end is not higher than the predetermined standard or when the timing signal reflects completion of timing, the control circuit turns the switch on, otherwise the control circuit keeps the switch off. The trigger circuit is capable of providing a trigger signal according to the detection result of the detector and a signal level at the sample end. And the latch is connected to the sample end, and is triggered by the trigger signal to sample a signal level at the sample end for generating the indication signal accordingly. The latch can be a flip-flop, thus the indication signal is provided as a logic signal.

With aforementioned circuits, another objective of the invention is providing an over-voltage indicator formed by a comparison mechanism, a detection-control mechanism and a latch. The comparison mechanism is capable of comparing whether the signal level at the I/O port is higher a predetermined voltage (VCCA+Vtp); if so, the comparison mechanism provides a logic high level at a sample end. The detection-control mechanism is capable of operating in a detection state and a timing state; when the detection-control mechanism operates in the detection state, if the signal level of the I/O port is higher than the predetermined voltage (VCCA+Vtp), then the detection-control mechanism switches to operate in the timing state; otherwise the detection-control mechanism keeps operating in the detection state and provides a logic low level at the sample end; and when the detection-control mechanism operates in the timing state, the detection-control mechanism switches to operate in the detection state after timing a predetermined interval. When the detection-control mechanism switches states, the latch is triggered to sample the signal level at the sample end and adjusts a signal level of the indication signal accordingly; when the latch is not triggered, the latch keeps the signal level of the indication signal. The comparison mechanism can be implemented using the comparator discussed above, and the detection-control mechanism can be implemented with the switch, the timer, the detector, the control circuit, the trigger circuit and the load.

When the detection-control mechanism operates in the detection state, the detection end of the detector is conducted to the sample end of the comparator. If over-voltage does not happen, the comparator does not conduct, and then the grounded load (e.g., a resistor) keeps a low level (logic low level) at the detection end and the sample end. While the detector detects the low level at the detection end, the timer is not triggered. On the other hand, if over-voltage happens, the comparator and the switch conduct an electrical connection along the I/O port, the sample end and the detection end, so the signal level at the sample end is therefore risen (to a logic high level), and the detector will detect the rising signal level at the detection end. At this time, the detection-control mechanism will switch to operate in a timing state: the detector triggers the timer to start timing and turns off the switch through the operation of the control circuit. Since the switch is turned off, the electrical connection along the I/O port, the sample end and the detection end no longer conducts to protect the detector from damage caused by long exposure in over-voltage. The triggered timer will turn the switch back on after timing a predetermined interval. When the switch is turned on again, if over-voltage maintains, the electrical connection along the I/O port, the sample end and the detection end conducts again, the detector will again detect a high level at the detection end and then turn the switch off, and the timer is triggered for timing again. On the other hand, if over-voltage ends when the switch is turned on again, the detector detects a low signal level and keeps states of the timer and the switch. According to the signal level at the sample end and the detection result of the detector, the trigger circuit triggers the latch to sample the signal level at the sample end, and the indication signal generated by the latch can therefore reflect beginning and end of over-voltage.

Another objective of the invention is integrating the aforementioned over-voltage indicator with an internal circuit and a buffer, an n-well pull-up circuit, a gate-tracking circuit in an I/O circuit of a system circuit (e.g., a chip or an IC) to provide a better over-voltage indication/protection mechanism. The n-well pull-up circuit capable of providing a gate signal according to the signal level at the I/O port; wherein when the signal level of the I/O port is higher than the predetermined conduction level, then n-well pull-up circuit makes a signal level of the gate signal rise. The gate tracking circuit connected between the internal circuit and the buffer for controlling electrical connection between the internal circuit and the buffer; wherein the internal circuit is connected to the gate tracking circuit at a transmission end, and the gate tracking circuit also has a gate end capable of receiving the gate signal. To work with the gate tracking circuit, for example, the internal circuit can perform a protection procedure (like keeping a high level input for the gate-tracking circuit to resolve gate oxide reliability concern) in response of over-voltage based on information provided by the over-voltage indication signal.

With circuit structures mentioned above, another objective of the invention is providing a method for over-voltage indication, which switches between two states. The method includes: in a detection state, comparing whether a signal level at the I/O port is higher than a voltage (VCCA+Vtp); if so, asserting a logic high level in the indication signal, and terminating the detection state for switching to a timing state; otherwise keeping a logic low level in the indication signal and maintaining in the detection state. In the timing state, timing for a predetermined interval and terminating the timing state for switching to the detection state. Switching between the states not only detects beginning and end of over-voltage, also protects the over-voltage indicator from being damaged by long exposure in over-voltage.

Still another objective of the invention is providing a method capable of handling over-voltage events at an I/O port of a system circuit (a chip or an IC), the method includes: performing an over-voltage indication for providing an indication signal to indicate whether over-voltage occurs at the I/O port; feeding-back the indication signal to the internal circuit; and when the indication signal indicates over-voltage, making the internal circuit perform a protection procedure in response of over-voltage. As the example discussed above, the internal circuit can keep a high level input for the gate-tracking circuit to resolve gate oxide reliability issue during over-voltage.

The above contents of the present invention will become more readily apparent to those ordinarily skilled in the art after reviewing the following detailed description and accompanying drawings, in which:

DETAILED DESCRIPTION OF THE PREFERRED EMBODIMENT

Figure 2:
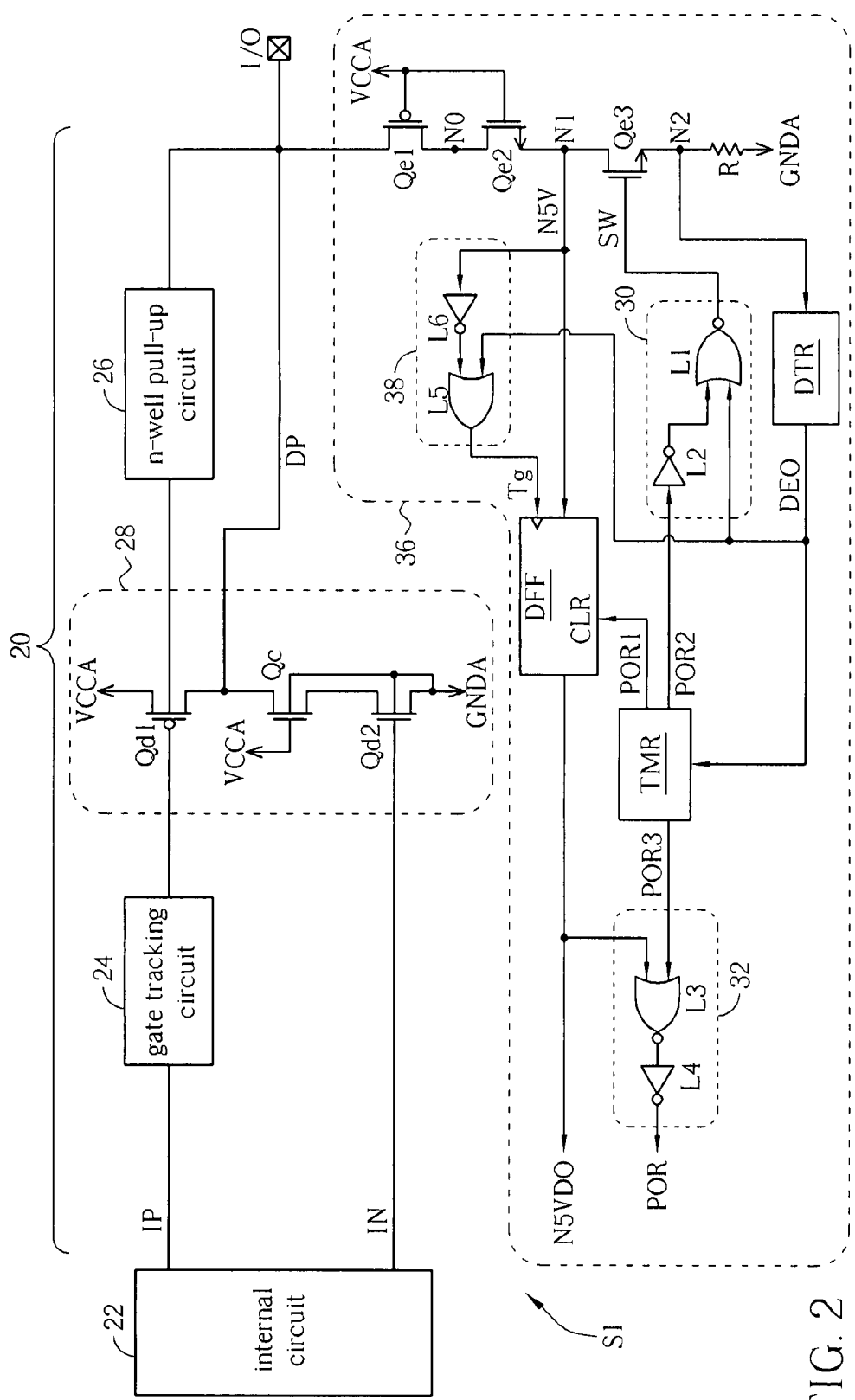
FIG. 2 illustrates circuit structures of an internal circuit, an I/O circuit and an over-voltage protection mechanism according to one embodiment of the invention.

Please refer to FIG. 2; FIG. 2 illustrates an exemplary embodiment of an over-voltage indicator 36 set in a system circuit S1 (e.g., an IC or a chip) according to the presented invention. As shown in FIG. 2, the system circuit S1 may have an internal circuit 22 and an I/O circuit 20. The internal circuit 22 may be a core circuit of the system circuit S1 or a pre-driver for signal outputting. The I/O circuit 20 includes a buffer 28 for signal driving. The buffer 28 is connected between the internal circuit 22 and an I/O port (labeled as I/O in FIG. 2), wherein the I/O port may be an I/O pad (or pin) of the system circuit S1. Information outputted from the internal circuit 22 can be inputted to the I/O circuit 20 by input signals IP and IN (the signals IP and IN may be a differential pair of signals). Then the buffer 28 in the I/O circuit 20 can drive an output signal DP at the I/O port according to the input signals IP and IN, such that information of the internal circuit 22 can be outputted through the I/O circuit 20. The I/O circuit 20 is biased between operation bias voltages VCCA (a positive bias) and GAND (a ground).

As discussed previously, when the I/O circuit 20 is working, over-voltage may occur at the I/O port owing to some unexpected reasons (like short-circuit). Therefore the over-voltage indicator 36 of the invention is designed to detect whether over-voltage happens at the I/O port and to reflect beginning and end of over-voltage with an indication signal N5VDO. In a preferred embodiment of the invention, the indication signal N5VDO can be provided as a standard logic signal with a logic high level approaching the voltage VCCA and a logic low level approaching the voltage GNDA. Then this indication signal N5VDO can be fed-back to the internal circuit 22. According to indication of the indication signal N5VDO, the internal circuit 22 can perform a proper protection procedure in response of over-voltage.

In the embodiment of FIG. 2, the over-voltage indicator 36 includes: a p-channel MOS (Metal-Oxide-Semiconductor) transistor Qe1 as an comparator, an n-channel MOS transistor Qe2 as a level adjust circuit, another n-channel MOS transistor Qe3 as a switch, a resistor R as a load and a timer TMR, a control circuit 30, a detector DTR, a trigger circuit 38 and a lath DFF. The transistors Qe1, Qe2, Qe3 and the resistor R are serially connected between the I/O port, nodes N0, N1, N2 and the voltage GNDA. In the serial connection of the transistor Qe1-Qe2-Qe3 and the transistor R, the node N1 can be considered as a sample end, and the node N2 can be considered as a detection end. The transistor Qe1 is connected between the I/O port and the node N0 with its gate biased at voltage VCCA. With normal signal output at the I/O port, the signal level at the I/O port should be kept in a range between the operation bias voltages VCCA and GNDA, so the transistor Qe1 will not conduct (i.e., the transistor Qe1 is off). On the contrary, when over-voltage occurs at the I/O port, the signal level at the I/O port will rise above the operation bias voltage VCCA, and thus a voltage difference between over-voltage and the voltage VCCA becomes larger than a threshold voltage Vtp of the transistor Qe1 to make the transistor Qe1 conduct. In other words, the transistor Qe1 can be considered as a comparator for comparing the signal level at the I/O port with a pre-determined conduction level (e.g., a voltage (VCCA+Vtp), where Vtp=|Vth_Qe1| and Vth_Qe1 is the threshold voltage of the transistor Qe1), and the transistor Qe1 can reflect comparison result by conducting or not conducting.

When over-voltage happens and the transistor Qe1 conducts, the transistor Qe2 also conducts the node N0 to the node N1. However, over-voltage will not directly feed into the node N1 from the node N0, because the transistor Qe2 can keep a signal level about voltage (VCCA−Vth_Qe2) at the node N1 (with Vth_Qe2 being the threshold voltage of the transistor Qe2), such that over-voltage will not propagate to circuits behind the node N1. Thus the over-voltage indicator 36 is protected from damage of over-voltage. That is, the stacked transistor Qe2 functions as a level adjust circuit for conducting an signal level adjusted from over-voltage at the I/O port to the node N1. The signal level at the node N1 (i.e., the sample end) is named as signal N5V.

The transistor Qe3 is capable of controlling electrical connection between the nodes N1 and N2, so it is considered as a switch. The detector DTR is connected to the detection end at the node N2 for detecting whether a signal level (e.g., a voltage level) at the node N2 is higher than a predetermined standard and for reflecting comparison result in a detection signal DEO. According to the signal DEO, the timer TMR can be triggered to start timing. After timing a predetermined interval, the timer TMR stops timing, and the beginning and end of timing are reflected in timing signals POR2 and POR3. In an embodiment of the invention, the signals POR2 and POR3 can be identical. The control circuit 30 is exemplarily implemented with a NOR gate L1 and an inverter L2, wherein the control circuit 30 is capable of providing a signal SW according to the detection signal DEO and the timing signal POR2, and the signal SW is used to control whether the switch transistor Qe3 is turned on or off. The trigger circuit 38 is exemplarily implemented with an OR gate L5 and an inverter L6, wherein the trigger circuit 38 generates a trigger signal Tg according to logic combination of the signal N5V and the detection signal DEO.

The latch DFF is connected to the sample end (node N1) and is capable of sampling the signal N5V according to the trigger signal Tg for generating the indication signal N5VDO. The latch DFF is exemplarily implemented using a standard logic flip-flop (like a D-flip-flop), so the generated indication signal N5VDO is a standard logic signal. When the latch DFF is triggered, it samples the signal level at the node N1 and reflects sampling results in the indication signal N5VDO. When the latch DFF is not triggered, it maintains the signal level of the indication signal N5VDO.

Figure 3:
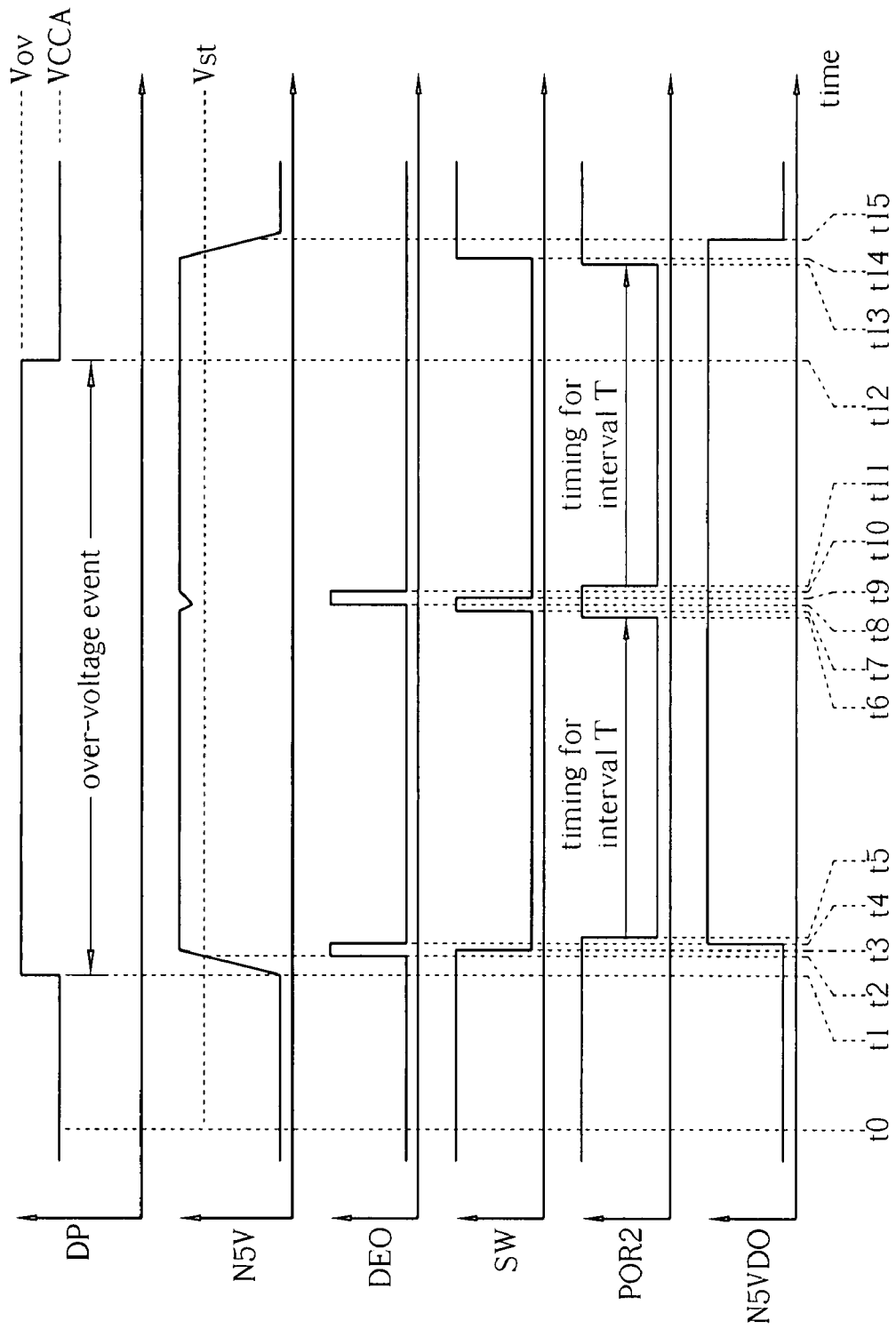
FIG. 3 shows waveforms and timing of signals related to the circuits in FIG. 2.

Operating of the over-voltage indicator 36 is described along with FIG. 3. Please refer to FIG. 3 (and FIG. 2); FIG. 3 exemplarily illustrates timings and waveforms of signals related to the over-voltage indicator 36 shown in FIG. 2. The transverse axis of each waveform in FIG. 3 represents time and the longitudinal axis represents waveform amplitude. At time t0, when over-voltage does not occur, the internal circuit 22 and the buffer 28 function normally, so the signal level of the signal DP at the I/O port alternates between the operation bias voltages VCCA and GNDA (in FIG. 3, a straight line shown along with the signal DP representing the operation bias voltage VCCA indicates an upper limit of the signal DP under normal operation). Under normal operation, the transistor Qe1 does not conduct, the resistor R connected to ground keeps a low level (approaching the voltage GNDA) at the node N2. The detector detects the low level at the node N2, and keeps a low level in the signals DEO accordingly. The low level in the detection signal DEO will not trigger the timer TMR, and a high level in the timing signal POR2 reflects that the timer TMR is not triggered for timing. The control circuit 30 performs logic operation according to the timing signal POR2 and the detection signal DEO and keeps a high level in the signal SW, therefore the switch transistor Qe3 is on. The turned-on transistor Qe3 conducts the node N1 to the node N2, so the signal N5V at the node N1 is kept at a low level. Static levels in the signals N5V and Tg will not trigger the latch DFF, so the latch DFF keeps a low level in the indication signal N5VDO. In other word, when there is no over-voltage at the I/O port, even an alternating signal is transmitted at the I/O port, the detector DTR, the latch DFF and the timer TMR are kept static, and the related signals N5V, SW, DEO and POR2 are kept in static levels.

Assume that over-voltage starts to attack the I/O port at time t1, then the signal level of the signal DP will rise to a level Vov (FIG. 3) above the normal operation bias voltage VCCA. For example, a normal operation bias voltage VCCA can be 3.3V, but the level Vov of over-voltage can be higher than 5V. Under such circumstance, the transistor Qe1 starts to conduct and makes the signal N5V rise along with the signal DP. Meanwhile, turned-on transistor Qe3 causes the signal level at the node N2 to rise along with that at the node N1. At time t2, the detector DTR detects that the signal at the node N2 has risen above a predetermined standard (level Vst in FIG. 3) following the signal N5V, then the detector DTR asserts a high level in the detection signal DEO to reflect the detection result. Transition to a high level in the detection signal DEO causes a transition to a low level in the signal SW through operation of the control circuit 30 at time t3, and the low level in the signal SW turns off the transistor Qe3 to stop electrical connection between nodes N1 and N2. The transistor Qe2 (the level adjust circuit) can protects the over-voltage indicator 36 from damage of over-voltage. Since the electrical connection between nodes N1 and N2 is terminated, the resistor R connected to ground (the voltage GNDA) will pull down the signal level at the node N2. The detector DTR detects the lowed level at the node N2 and then pulls down the signal level of the detection signal DEO at time t4 to reflect the detection result. On the other hand, the transition in the signal DEO is also reflected in the trigger signal Tg through operation of the trigger circuit 38. Then the latch DFF is triggered to sample the signal N5V at the node N1 by the transition in the trigger signal Tg, such that a transition to a high level in the indication signal N5VDO at time t4 indicates the beginning of over-voltage.

In addition, at time t5, the timer TMR is triggered to start timing by the transition in the detection signal DEO. The timer TMR pulls down the timing signal POR2 at time t5 to reflect a timing duration. After timing a predetermined interval T, the timer TMR stops timing at time t6 and then asserts a high level in the timing signal POR2 to reflect end of timing. The switch transistor Qe3 keeps off during time t5 to t6, and the signal level at the node N2 keeps low. When timing stops at time t6, the transition to high level in the timing signal POR2 causes a transition to a high level in the signal SW at time t7 through operation of the control circuit 30, and the switch transistor Qe3 is turned on again. Assuming over-voltage continues, a high level at the node N1 will again conducts to the N2 through the transistor Qe3 (at the moment the transistor Qe3 starts to conduct, a short transient to build the high level at the node N2 may be slightly reflect in the signal N5V, as shown in FIG. 3). Again the detector DTR detects the high level at the node N2 and asserts a rising transition in the detection signal DEO at time t8 to reflect that a high level is detected again. According to the rising transition in the detection signal DEO, the control circuit 30 causes a falling transition in the signal SW at time t9. The transistor R again pulls down the signal level at the node N2, and the detector DTR pulls down the signal DEO after detecting the low level at time t10.

After time t8, the transition in the detection result of the detector DTR causes a transition in the trigger signal Tg through operation of the trigger circuit 38, and then the latch DFF is trigger to sample the signal again. The indication signal N5VDO keeps the high level to reflect continuity of over-voltage. On the other hand, the timer TMR is triggered to timing again at time t11, and causes a transition to a low level in the timing signal POR2 to indicate beginning of timing. In the case shown in FIG. 3, the over-voltage is assumed to end at time t12. When over-voltage ends, the transistor Qe1 stops conduction. However, the switch transistor Qe3 is off, so the signal N5V is kept at a high level. After timing a predetermined interval T, the timer TMR stops timing at time t13 and causes a transition back to a high level in the timing signal POR2. According to the high level in the signal POR2, the control signal 30 causes a transition to a high level in the signal SW at time t14 to turn on the switch transistor Qe3 again. Because over-voltage is over and the transistor Qe1 is turned off, the turned-on transistor Qe3 forms an electrical connection along the nodes N1, N2 and the grounded transistor R, signal levels at the nodes N1 and N2 fall to a low level close to ground (i.e., the voltage GNDA). At time t15, the signal N5V turns to a low level, and the transition triggers the latch DFF to sample the signal N5V again though the trigger signal Tg. When the latch DFF samples the low level in the signal N5V, it cause a transition to a low level in the indication signal N5VDO to indicate the end of over-voltage. Also, the detector DTR detects the low level in the signal DEO and stops triggering the timer TMR. In other words, when over-voltage ends, the transistors Qe1-Qe3, the detector DTR, the timer TMR, the latch DFF all resume operation states at time t0.

The aforementioned operation of the over-voltage indicator 36 can be summarized as two states, whether the switch transistor Qe3 is turned on or off reflects switching of states. The transistors Qe1 and Qe2 implement a comparison mechanism. The switch transistor Qe3, the resistor R, the detector DTR, the timer TMR, the control circuit 30 and the trigger circuit 38 implement a detection-control mechanism. When the transistor Qe3 is turned on, the detection-control mechanism operates in a detection state, wherein the detector DTR keeps on detecting the signal level at the node N2. If over-voltage does no happen (e.g., at time t0), the detection-control mechanism keeps its operation state (i.e., the detection state). On the contrary, if over-voltage occurs (i.e., when the signal level at the I/O port rises above the voltage VCCA+Vtp), the transistors Qe1 and Qe2 in the comparison mechanism conduct to reflect over-voltage to the nodes N1 and N2. Then the control-detection mechanism can turn off the switch transistor Qe3 through a first loop connecting the node N2, the detector DTR, the control circuit 30 and the switch transistor Qe3, such that the detection-control mechanism switches to operate in a timing state (like the operation between time t5 and time t6, FIG. 3). In the timing state, the switch transistor Qe3 is off, over-voltage is no longer reflected to the node N2, and the timer TMR starts timing. When timing is completed (e.g., at time t6), the timer TMR can turn on the switch transistor Qe3 again through a second loop connecting the node N2, the detector DTR, the timer TMR, the control circuit 30 and the transistor Qe3, so the detection-control mechanism again operates in the detection state. In the detection state, if over-voltage continues, over-voltage is again reflected to the node N2 through the turned-on transistor Qe3, and then the transistor Qe3 is turned off through the first loop. Thus the detection-control mechanism operates in the timing state again (e.g., after time t11). On the contrary, if over-voltage ends under the detection state, the detection-control mechanism will keep on operating in the detection state. As the detection-control mechanism switches states, the latch DFF is triggered to sample for reflecting the beginning and end of over-voltage in the indication signal N5VDO.

In other words, when over-voltage occurs, instead of a continuous monitoring of over-voltage, the disclosed over-voltage indicator 36 of the invention only performs a periodical detection, thus the over-voltage indicator 36 does not sink current from the I/O port. That is, when over-voltage happens, the over-voltage indicator 36 does not have to drain much current from the I/O port for performing over-voltage indication.

In the embodiment discussed in FIG. 3, time differences between times t2, t3, t4, t5 (and times t6, t7, t8, t9, t10, t11) are basically caused by operation delay of the circuits, these time differences are in a range about ns (1 ns=10^(−9) second). On the other hand, the timing interval T of the timer TMR may has a time scale around µs (1 µs=1000 ns).

Figure 1:
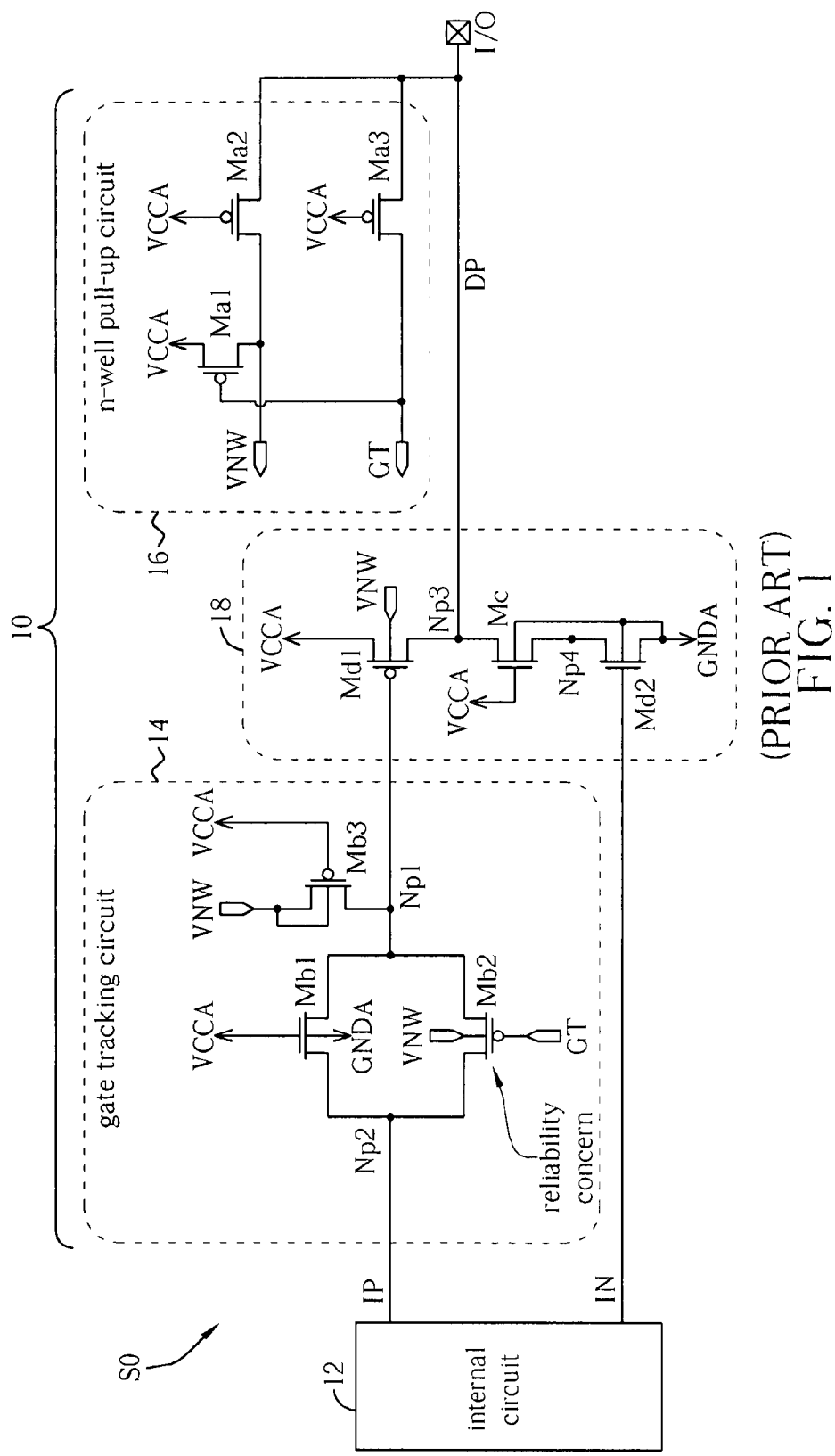
FIG. 1 illustrates a prior art circuit structures of an internal circuit, an I/O circuit and an over-voltage protection mechanism.
Figure 4:
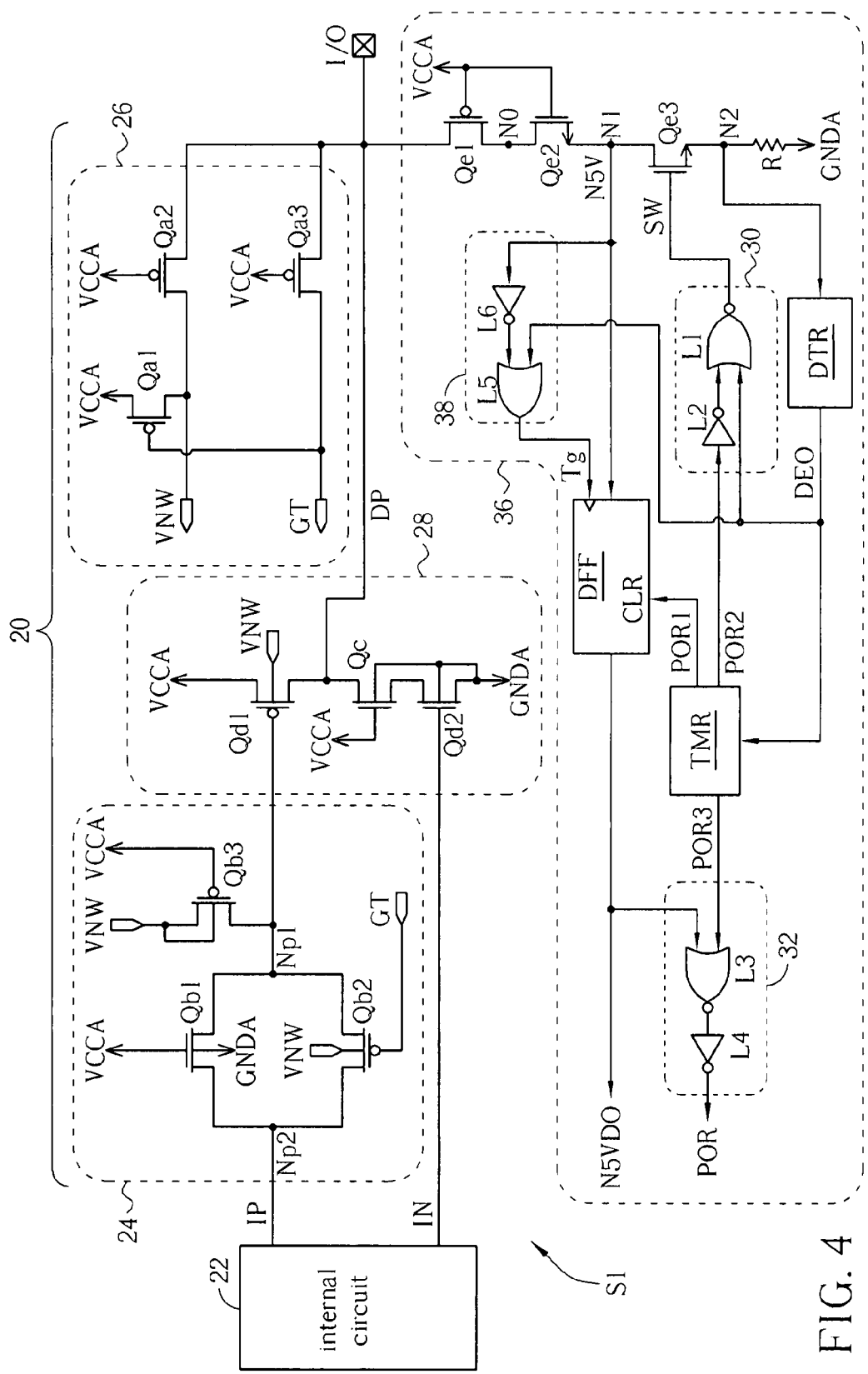
FIG. 4 shows exemplary implementation details of the circuits in FIG. 2.

Please refer to FIG. 2 again. As shown in FIG. 2, the over-voltage indicator 36 of the invention can be integrated with the original over-voltage protection mechanism implemented by the gate tracking circuit 24 and n-well pull-up circuit 26, such that the overall over-voltage protection mechanism can be enhanced. A further detail is shown in FIG. 4, where the embodiment of the gate tracking circuit 24 and the n-well pull-up circuit 26 are illustrated. The n-well pull-up circuit 26 capable of providing a gate signal GT and a signal VNW is exemplarily implemented using p-channel MOS transistors Qa1 to Qa3. The gate tracking circuit 24 has transistors Qb1, Qb2 forming a transmission gate and another transistor Qb3. Circuitry structures and operations of the gate tracking circuit 24 and the n-well pull-up circuit 26 are similar to those of the gate tracking circuit 14 and the n-well pull-up circuit 16. However, as discussed in FIG. 1, when over-voltage occurs, the gate oxide of the transistor Qb2 in the gate tracking circuit 24 suffers a reliability issue. When over-voltage attacks, the gate signal GT and the signal level at the node Np1 for the transistor Qb2 both rise following over-voltage; if the signal IP at the node Np2 from the internal circuit 22 happens to be a logic low level (close to the voltage GNDA), then the low level at the node Np2 and the over-voltage level in the gate signal GT will cause a major voltage difference cross the gate oxide of the transistor Qb2, which may lead to a damage of the transistor Qb2.

Since the over-voltage indicator 36 of the invention is designed to provide a logic indication signal N5VDO to indicate the beginning and end of over-voltage, the indication signal N5VDO is fed-back to the internal circuit 22, such that the internal circuit 22 can perform a proper protection procedure during over-voltage. For example, when the indication signal N5VDO indicates that over voltage occurs, the internal circuit 22 can raise the signal IP to a high level, then the voltage difference between the node Np2 and the gate signal GT will reduce below a safe voltage difference (e.g., breakdown voltage of the gate-oxide of the transistor Qb2), and the reliability issue of the transistor Qb2 can be resolved. Surely the internal circuit 22 can perform other kinds of protection procedures with information provided by the indication signal N5VDO.

While implementing the disclosed circuits, a comparison circuit with hysteretic characteristic (such as a Schmidt trigger with hysteretic characteristic) can be adopted to implement the detector DTR. The timer TMR is either a specific timer designed for the over-voltage indicator 36, or a power-on reset (POR) circuit commonly used in ordinary I/O circuit. Usually a chip or an IC has a POR circuit for providing a power-on reset signal to reflect the voltage levels of the operation bias voltages. When a chip starts to power on with its operation bias voltages gradually rising above a predetermined level, the POR circuit in the chip starts timing a predetermined interval, and alternates the signal level in the power-on reset signal after timing completes. This signal transition in the power-on reset signal is used to reflect that the operation bias voltages are ready; so state machines and flip-flops in the internal circuit (core circuit) of the chip can be reset for initialization accordingly. Because the POR circuit itself has a timing functionality, it can be used to implement the timer TMR in the over-voltage indicator of the invention.

However, to maintain a correct power-on reset signal, an additional auxiliary circuit 32 is set in the over-voltage indicator 36, as shown in FIG. 2 (as well as FIG. 4). The signals POR2 and POR3 originally provided by the timer TMR (here a POR circuit) are used as timing signals required by the over-voltage indicator 36, and the signal POR provided by the auxiliary circuit 32 is used as the correct power-on reset signal. As shown in FIG. 2 (and FIG. 4), the auxiliary circuit 32 has an inverter L4 and a NOR gate L3, so the auxiliary circuit 32 is capable of generating the correct power-on reset signal POR according to the indication signal N5VDO and the timing signal POR3. Also, signal POR1 is provided to a clear end CLR of the latch DFF. The signals POR and POR1 are identical in an embodiment of the invention.

Figure 5:
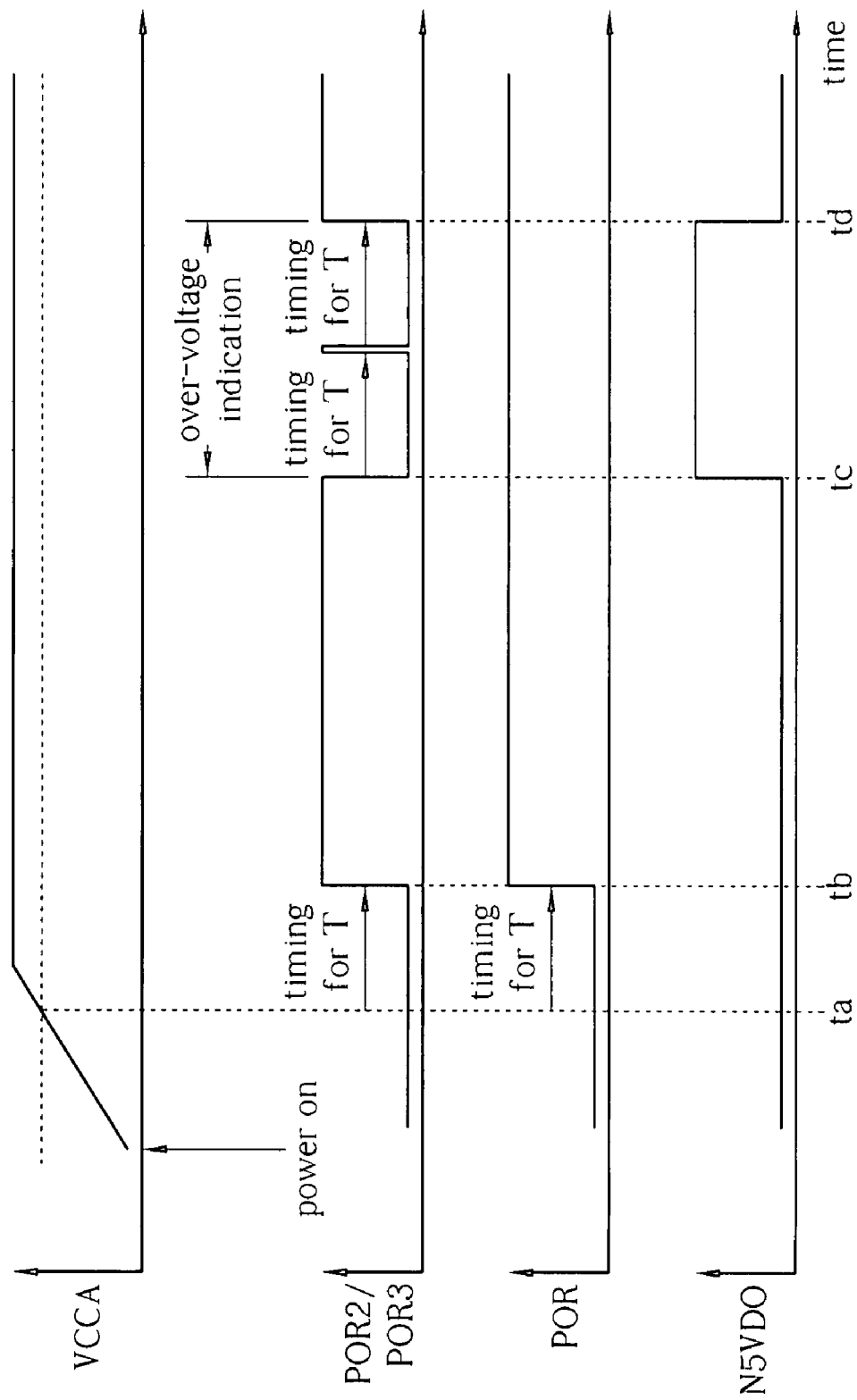
FIG. 5 shows waveforms and timing of related signals if a power-on reset circuit is used as the timer in FIG. 2.

Please refer to FIG. 5 (as well as FIG. 2); FIG. 5 illustrates waveforms and timing of related signals as a POR circuit is adopted for the timer TMR. The transverse axis of FIG. 5 represents the time axis. In the beginning, while the system circuit S1 starts to power on, the voltage level of the operation bias voltage VCCA will gradually rise. At time ta, the voltage VCCA rise above a predetermined level and the timer TMR (here a POR circuit) starts timing. After a predetermined interval T, timing is completed at time tb, and the signals POR, POR1-POR3 alternate from a low level to a high level at time tb to reflect a power-ready. The signal POR1 clears the latch DFF, such that the indication signal N5VDO keeps at a low level. On the mark of the signal POR at time tb, all circuits in the system circuit S1 (including the internal circuit 22 and the I/O circuit 20) start initializing normal operations. If over-voltage occurs at time tc, the POR circuit functions as the timer TMR for the over-voltage indicator 36, and then the timing signal POR2 and POR3 alternate following the operation of the detection-control mechanism (as described for FIG. 3), and the indication signal N5VDO has a transition from a low level to a high level to reflect beginning of over-voltage. Later the indication signal N5VDO has a transition back to the low level at time td to indicate end of over-voltage. However, because of operation of the auxiliary circuit 32, the signal POR constantly keeps at the high level, so the signal POR can be adopted as a correct power-on reset signal. In other words, the signal POR alternate only during power-on procedure; after power-on (and the operation bias voltages are ready), the signal POR will not alternate whether over-voltage occurs or not. So the signal POR fits the standard behavior of a correct power-on reset signal.

Because the timing functionality of the disclosed over-voltage indicator can be implemented using a POR circuit originally set in the chip, layout area overhead of the disclosed over-voltage indicator 36 can be effectively reduced. On the other hand, as mentioned previously, the timer TMR can be alternatively implemented using a specific timer independent of the POR circuit such that the auxiliary circuit 32 is no longer needed.

To sum up, comparing to the limited over-voltage protection techniques of prior art, the disclosed over-voltage indication techniques can expand the scope of over-voltage protection to the internal circuit (a pre-driver and/or a core circuit), such that the internal circuit can perform its own protection procedure to cooperate with the over-voltage protection mechanism in the I/O circuit according to the indication signal. In this way, a more robust and enhanced over-voltage protection mechanism can be achieved. In addition, the over-voltage indicator detects over-voltage on a periodic basis, which prevents the over-voltage indicator from continuous damage owing to long exposure in over-voltage. Also the disclosed over-voltage indicator can easily integrated with the original I/O circuit (e.g., implementing the timer with a POR circuit), so the layout area overhead can be effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An over-voltage indicator capable of providing an indication signal to reflect a first voltage at an I/O port, the over-voltage indicator comprising:
   a comparator connected between the I/O port and a sample node, determining whether the first voltage at the I/O port is higher than a first predetermined voltage; if so, the comparator connects the I/O port to the sample node; if not, the comparator terminates connecting the I/O port to the sample node;
   a switch connected between the sample node and a detection node; wherein when the switch is turned on, the switch connects the sample node to the detection node; when the switch is turned off, the switch terminates connecting between the sample node and the detection node;
   a timer capable of providing a timing signal; wherein when the timer is triggered, the timer starts timing for a predetermined interval, and the timer reflects completion of timing using the timing signal;
   a detector connected to the detection node; determining whether a second voltage at the detection node is higher than a second predetermined voltage; if so, the detector triggers the timer to start timing;
   a control circuit connected between the timer, the detector and the switch, wherein when the detector detects that the second voltage at the detection node is not higher than the second predetermined voltage or when the timing signal reflects completion of timing, the control circuit turns the switch on, otherwise the control circuit keep the switch off;
   a trigger circuit capable of providing a trigger signal according to detection result of the detector and a third voltage at the sample node; and
   a latch connected to the sample node, the latch capable of providing the indication signal according to the trigger signal;
   wherein the comparator, the sample node, the switch and the detection node are connected in series.

2. The over-voltage indicator of claim 1 further comprising:
   a load connected to the detection node; wherein when the switch is turned on and the comparator stops connecting, the load is capable of keeping the second voltage at the detection node lower than the second predetermined voltage.

3. The over-voltage indicator of claim 2, wherein the load is a resistor.

4. The over-voltage indicator of claim 1 further comprising:
   a level adjusted circuit connected between the comparator and the sample node, wherein the comparator connects the I/O port to the level adjusted circuit and provides the first voltage to the level adjusted circuit, and the level adjusted circuit reduced the first voltage to the third voltage and provides the third voltage to the sample node.

5. The over-voltage indicator of claim 1, wherein the timer is a power-on reset (POR) circuit.

6. The over-voltage indicator of claim 5 further comprising:
   an auxiliary circuit connected to the timer, the auxiliary circuit capable of providing a power-on reset signal, when the detector triggers the timer, the auxiliary circuit is capable of maintaining a signal level of the power-on reset signal.

* * * * *